US012712495B2

(12) United States Patent
Suo et al.

(10) Patent No.: US 12,712,495 B2
(45) Date of Patent: Aug. 18, 2026

(54) MULTIBAND POWER AMPLIFIER CIRCUIT AND RADIO FREQUENCY TRANSCEIVER

(71) Applicant: Huawei Technologies Co., Ltd., Shenzhen (CN)

(72) Inventors: Hailei Suo, Chengdu (CN); Liang Yi, Chengdu (CN); Yijun Sun, Chengdu (CN); Jie Sun, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 406 days.

(21) Appl. No.: 18/361,461

(22) Filed: Jul. 28, 2023

(65) Prior Publication Data

US 2023/0370024 A1 Nov. 16, 2023

Related U.S. Application Data

(63) Continuation of application No. PCT/CN2021/074408, filed on Jan. 29, 2021.

(51) Int. Cl.

*H03F 1/42* (2006.01)
*H03F 1/32* (2006.01)
*H03F 1/56* (2006.01)
*H03F 3/21* (2006.01)

(52) U.S. Cl.

CPC ............. *H03F 1/42* (2013.01); *H03F 1/3205* (2013.01); *H03F 1/56* (2013.01); *H03F 3/21* (2013.01); *H03F 2200/387* (2013.01); *H03F 2200/451* (2013.01)

(58) Field of Classification Search

CPC . H03F 1/42; H03F 1/3205; H03F 1/56; H03F 3/21; H03F 2200/387; H03F 2200/451

USPC .......................................................... 330/295

See application file for complete search history.

(56) References Cited

U.S. PATENT DOCUMENTS

| | | | | |
|---|---|---|---|---|
| 6,785,518 | B2 * | 8/2004 | Atkinson ............... | H04B 1/403 455/86 |
| 8,508,295 | B2 * | 8/2013 | Matsunaga ............... | H03F 1/56 330/124 R |
| 9,866,234 | B1 * | 1/2018 | Tseng .................. | H03M 1/0678 |
| 10,242,960 | B2 | 3/2019 | De Boet et al. | |

(Continued)

FOREIGN PATENT DOCUMENTS

| | | |
|---|---|---|
| CN | 108599727 A | 9/2018 |
| CN | 111600559 A | 8/2020 |

(Continued)

*Primary Examiner* — Hafizur Rahman
(74) *Attorney, Agent, or Firm* — Slater Matsil, LLP

(57) ABSTRACT

Embodiments of this application provide a multiband power amplifier circuit and a radio frequency transceiver, to increase a VBW while ensuring linear correction and reducing a circuit loss. The multiband power amplifier circuit includes a first power transistor, a second power transistor, a first matching circuit, a second matching circuit, a third matching circuit, and a combiner. The first power transistor is coupled to a first input end of the combiner via the first matching circuit. The second power transistor is coupled to a second input end of the combiner via the second matching circuit. A first end of the third matching circuit is coupled to an output end of the first power transistor, and a second end of the third matching circuit is coupled to an output end of the second power transistor.

13 Claims, 11 Drawing Sheets

(56) References Cited

U.S. PATENT DOCUMENTS

| | | | | |
|---|---|---|---|---|
| 10,453,810 | B2 | 10/2019 | De Boet et al. | |
| 10,903,806 | B2 * | 1/2021 | Anderson | H03F 1/565 |
| 2002/0067211 | A1 | 6/2002 | Matsuyoshi et al. | |
| 2005/0083133 | A1 * | 4/2005 | Amano | H03F 3/265 330/301 |
| 2006/0211381 | A1 * | 9/2006 | Jensen | H04B 1/403 455/260 |
| 2009/0102553 | A1 * | 4/2009 | Yang | H03F 1/0261 330/124 R |
| 2011/0025412 | A1 | 2/2011 | Matsunaga | |
| 2014/0210555 | A1 * | 7/2014 | Liou | H03F 3/193 330/296 |
| 2015/0295542 | A1 * | 10/2015 | Moronval | H03F 3/19 330/295 |
| 2017/0117856 | A1 * | 4/2017 | Zhu | H03F 1/565 |
| 2020/0195200 | A1 | 6/2020 | Wang | |
| 2020/0259460 | A1 * | 8/2020 | Wang | H03F 1/0288 |
| 2021/0194438 | A1 * | 6/2021 | Na | H03D 7/00 |

FOREIGN PATENT DOCUMENTS

| | | | | |
|---|---|---|---|---|
| EP | 1202446 | A2 * | 5/2002 | H03F 3/604 |
| JP | H04104604 | A | 4/1992 | |
| JP | H06152279 | A | 5/1994 | |
| JP | H09321509 | A | 12/1997 | |
| JP | 2002171144 | A | 6/2002 | |
| JP | 2002204131 | A | 7/2002 | |
| JP | 5402887 | B2 | 1/2014 | |

* cited by examiner

MULTIBAND POWER AMPLIFIER CIRCUIT AND RADIO FREQUENCY TRANSCEIVER

CROSS-REFERENCE TO RELATED APPLICATIONS

This application is a continuation of International Application No. PCT/CN2021/074408, filed on Jan. 29, 2021, the disclosure of which is hereby incorporated by reference in its entirety.

TECHNICAL FIELD

This application relates to the field of electronic technologies, and in particular, to a multiband power amplifier circuit and a radio frequency transceiver.

BACKGROUND

During designing of a power amplifier circuit, it is usually expected that the power amplifier circuit can operate on a plurality of frequency bands to improve device compatibility. For example, it is expected that the power amplifier circuit can operate on at least one of the following frequency bands: 758-960 MHz, 1805-1880 MHz, 2110-2170 MHz, or 2620-2690 MHz.

To reduce linear deterioration and decreased efficiency of a multiband power amplifier circuit in a multi-band working mode, a video bandwidth (VBW) of the multiband power amplifier circuit needs to be increased. In the conventional technology, the VBW is generally increased by adding a first-order or multi-order low-pass network to a drain of a power transistor in the multiband power amplifier circuit. As shown in FIG. 1*a*, a first-order low-pass network including a capacitor C1 and an inductor L1 is added to a drain of an insulated gate-enhanced P-channel metal oxide semiconductor (P-MOS) transistor. As shown in FIG. 1*b*, a second-order low-pass network including a capacitor C1, an inductor L1, a capacitor C2, and an inductor L2 is added to a drain of a P-MOS transistor. As shown in FIG. 1*c*, a second-order low-pass network including a capacitor C1, an inductor L1, a capacitor C2, an inductor L2, and a resistor R is added to a drain of a P-MOS transistor.

Simulation diagrams of multiband power amplifier circuits shown in FIG. 1*a*, FIG. 1*b*, and FIG. 1*c* are respectively shown in FIG. 2*a*, FIG. 2*b*, and FIG. 2*c*, where a horizontal coordinate indicates a frequency, a vertical coordinate indicates an impedance amplitude, and a local maximum value point indicates a resonance point. A value of a horizontal coordinate corresponding to a maximum value of the impedance amplitude is a VBW. It can be learned that, a VBW of the multiband power amplifier circuit shown in FIG. 1*a* is about 110 MHz, but increase of the VBW is not significant. VBWs of multiband power amplifier circuits shown in FIG. 1*b* and FIG. 1*c* are respectively about 550 MHz and 510 MHz. Although the VBWs can be increased, an additional resonance point near tens of MHz is introduced, affecting linear correction. In addition, the multiband power amplifier circuit shown in FIG. 1*c* uses the resistor R to reduce a resonance point quality factor, introducing additional losses.

SUMMARY

Embodiments of this application provide a multiband power amplifier circuit and a radio frequency transceiver, to increase a VBW while ensuring linear correction and reducing a circuit loss.

According to a first aspect, a multiband power amplifier circuit is provided, including: a first power transistor, a second power transistor, a first matching circuit, a second matching circuit, a third matching circuit, and a combiner. The first power transistor is coupled to a first input end of the combiner via the first matching circuit. The second power transistor is coupled to a second input end of the combiner by using the second matching circuit. A first end of the third matching circuit is coupled to an output end of the first power transistor, and a second end of the third matching circuit is coupled to an output end of the second power transistor. The third matching circuit is configured to directly connect the output end of the first power transistor to the output end of the second power transistor.

According to the multiband power amplifier circuit provided in embodiments of this application, the third matching circuit does not include an LC resonance circuit because the third matching circuit directly connects the output end of the first power transistor to the output end of the second power transistor. This can avoid an additional resonance point caused by introducing the LC resonance circuit. In addition, because the third matching circuit directly connects the output end of the first power transistor to the output end of the second power transistor, the third matching circuit does not include a resistor. This can avoid additional losses caused by introducing the resistor. In addition, for the output end of the first power transistor, because the first matching circuit is connected in parallel to the third matching circuit, and the third matching circuit is connected in series to the second matching circuit, the first matching circuit is connected in parallel to the second matching circuit. Alternatively, for the output end of the second power transistor, because the second matching circuit is connected in parallel to the third matching circuit, and the third matching circuit is connected in series to the first matching circuit, the first matching circuit is connected in parallel to the second matching circuit. Further, the first matching circuit is connected in parallel to the second matching circuit. This can decrease equivalent inductance of the first matching circuit and/or the second matching circuit. Further, it can be learned from the formula $$f = \frac{1}{2\pi\sqrt{LC}}$$

that, the inductor L or the capacitor C is inversely proportional to a value of the resonance frequency f. Therefore, as the equivalent inductance of the first matching circuit and/or the second matching circuit decreases, equivalent inductance of the entire multiband power amplifier circuit decreases, and a resonance frequency increases. Further, because a value of a resonance frequency of a resonance point corresponding to a maximum value of an impedance amplitude is a VBW, a VBW of the multiband power amplifier circuit increases accordingly with the increase of the resonance frequency of the multiband power amplifier circuit.

In conclusion, the multiband power amplifier circuit provided in embodiments of this application can increase the VBW and improve VBW-related features. In addition, the multiband power amplifier circuit provided in embodiments of this application can further improve a fundamental wave matching bandwidth, to implement good fundamental wave matching. This reduces a gap in performance such as linearity and efficiency between the multiband power amplifier circuit and a single-band power amplifier circuit on a specific frequency band.

With reference to the first aspect, in a possible implementation, the third matching circuit is at least one of a microstrip, an inductor, a bonding wire, or an integrated passive device. The third matching circuit in this application may be a direct current component such as the microstrip, the inductor, or the bonding wire, or a combination thereof, to increase the VBW and the fundamental wave matching bandwidth. A specific implementation of the third matching circuit is not limited in this application.

With reference to the first aspect, in a possible implementation, the third matching circuit is a capacitor. The third matching circuit in this application may be an alternating current component, for example, the capacitor or a combination thereof, to improve the fundamental wave matching bandwidth. A specific implementation of the third matching circuit is not limited in this application.

With reference to the first aspect, in a possible implementation, the third matching circuit is located inside packages/a package of the first power transistor and/or the second power transistor, or the third matching circuit is located outside packages of the first power transistor and the second power transistor, or the third matching circuit is located on an output pad of a die of the first power transistor and an output pad of a die of the second power transistor.

According to a second aspect, a multiband power amplifier is provided, and includes the multiband power amplifier circuit according to any one of the first aspect and the implementations of the first aspect. The multiband power amplifier is configured to amplify an input multiband signal.

According to a third aspect, a radio frequency transceiver is provided, and includes an analog baseband and the multiband power amplifier circuit according to any one of the first aspect and the implementations of the first aspect. The analog baseband is configured to output a multiband radio frequency signal to the multiband power amplifier circuit. The multiband power amplifier circuit is configured to amplify the multiband radio frequency signal.

For technical effects of the second aspect and the third aspect, refer to technical effects in any one of the first aspect and the implementations of the first aspect. Details are not described herein again.

DETAILED DESCRIPTION OF ILLUSTRATIVE EMBODIMENTS

The following describes the technical solutions in embodiments of this application with reference to the accompanying drawings in embodiments of this application. It is clear that the described embodiments are merely a part rather than all of embodiments of this application.

Terms such as "first" and "second" mentioned below are merely intended for a purpose of description, and shall not be understood as an indication or implication of relative importance or implicit indication of a quantity of indicated technical features. Therefore, a feature defined by "first" or "second" may explicitly or implicitly include one or more features.

In addition, in this application, position terms such as "top" and "bottom" are defined relative to positions of components in the accompanying drawings. It should be understood that these position terms are relative concepts used for relative description and clarification, and may correspondingly change based on changes in the positions of the components in the accompanying drawings.

In this application, unless otherwise clearly specified and limited, the term "connection" should be understood in a broad sense. For example, "connection" may be a manner of implementing an electrical connection for signal transmission, may be a direct electrical connection, or may be an indirect electrical connection via an intermediate medium. In the following solutions, a switch has two states: short circuit and open circuit. In some solutions, short circuit is also referred to as turned on, on state, switched on, electrically connected, and the like, and an open circuit is also referred to as turned off, switched off, and the like.

Figure 1A:
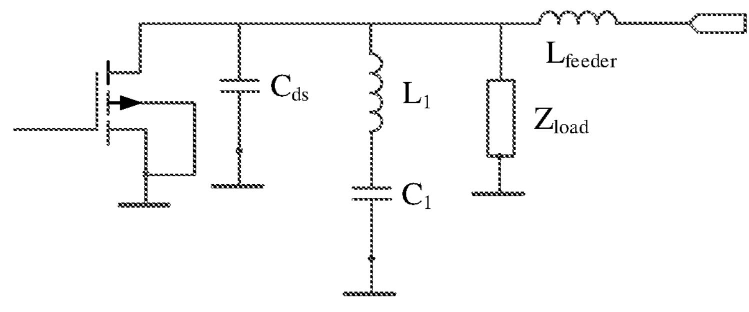
FIG. 1A is a schematic diagram 1 of a structure of a multiband power amplifier circuit in the conventional technology.
Figure 1B:
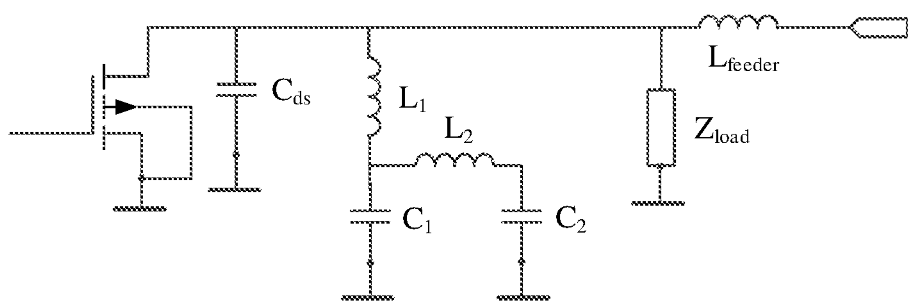
FIG. 1B is a schematic diagram 2 of a structure of a multiband power amplifier circuit in the conventional technology.
Figure 1C:
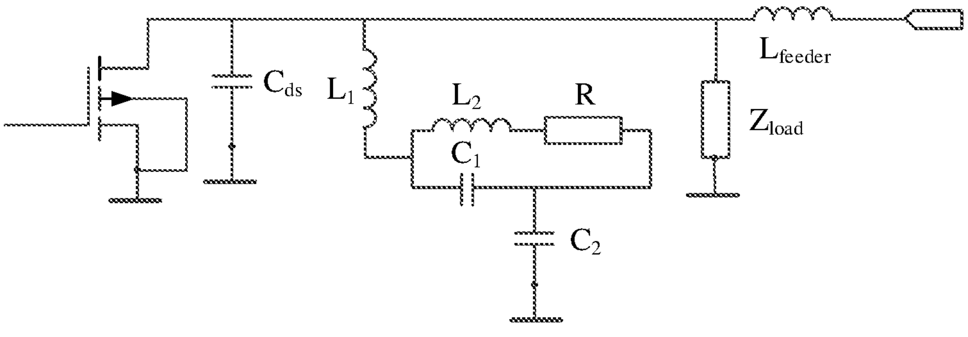
FIG. 1C is a schematic diagram 3 of a structure of a multiband power amplifier circuit in the conventional technology.
Figure 2A:
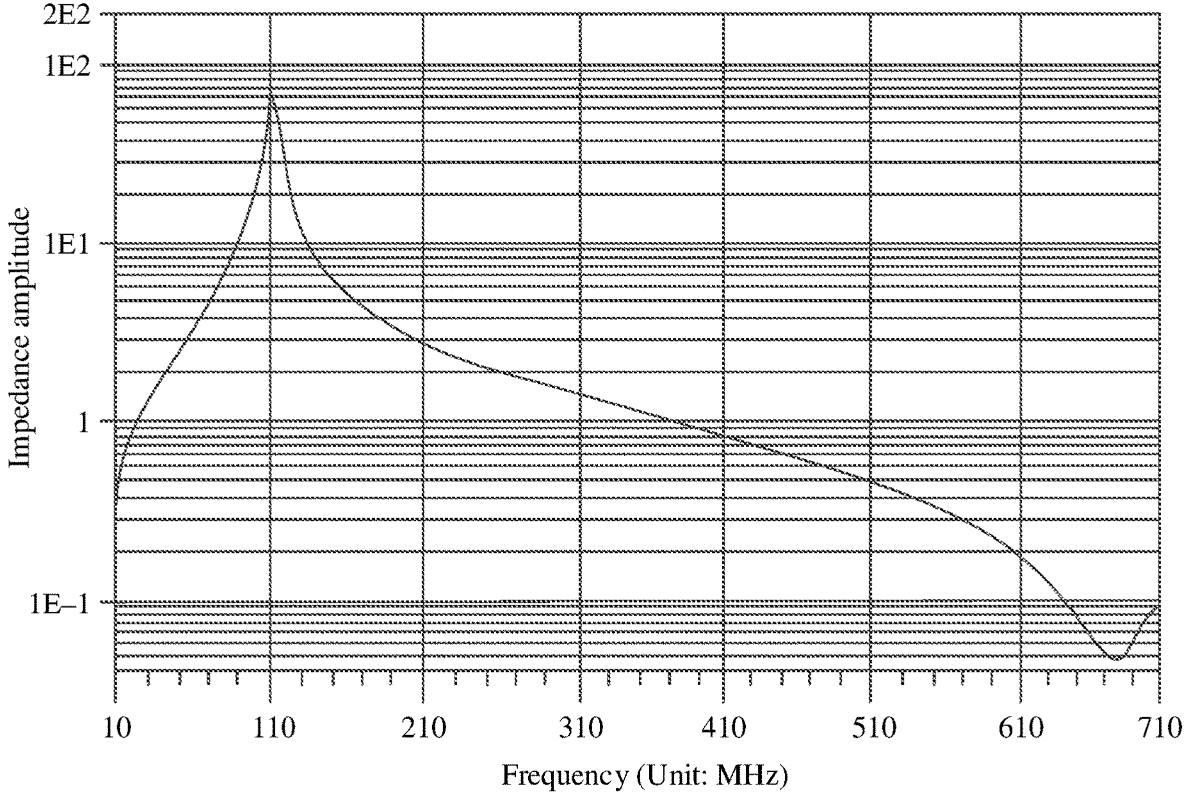
FIG. 2A is a simulation diagram of the multiband power amplifier circuit shown in FIG. 1*a;*
Figure 2B:
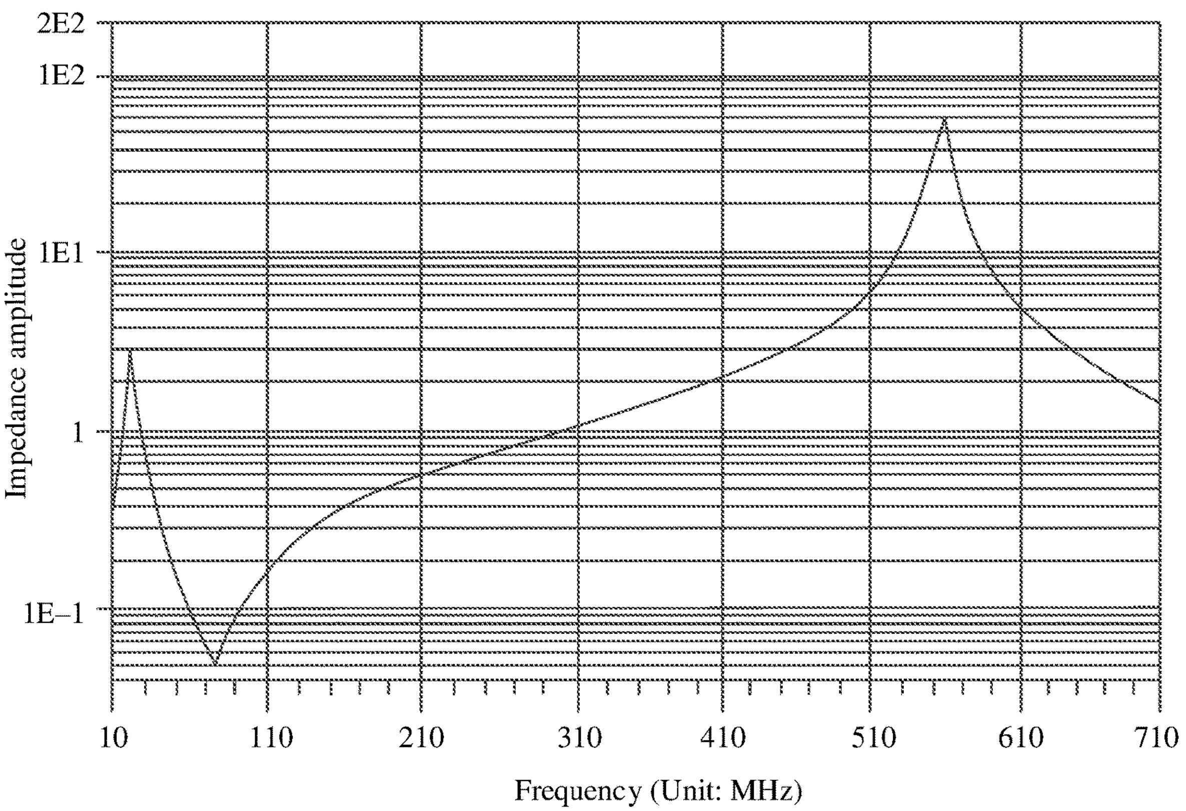
FIG. 2B is a simulation diagram of the multiband power amplifier circuit shown in FIG. 1*b;*
Figure 2C:
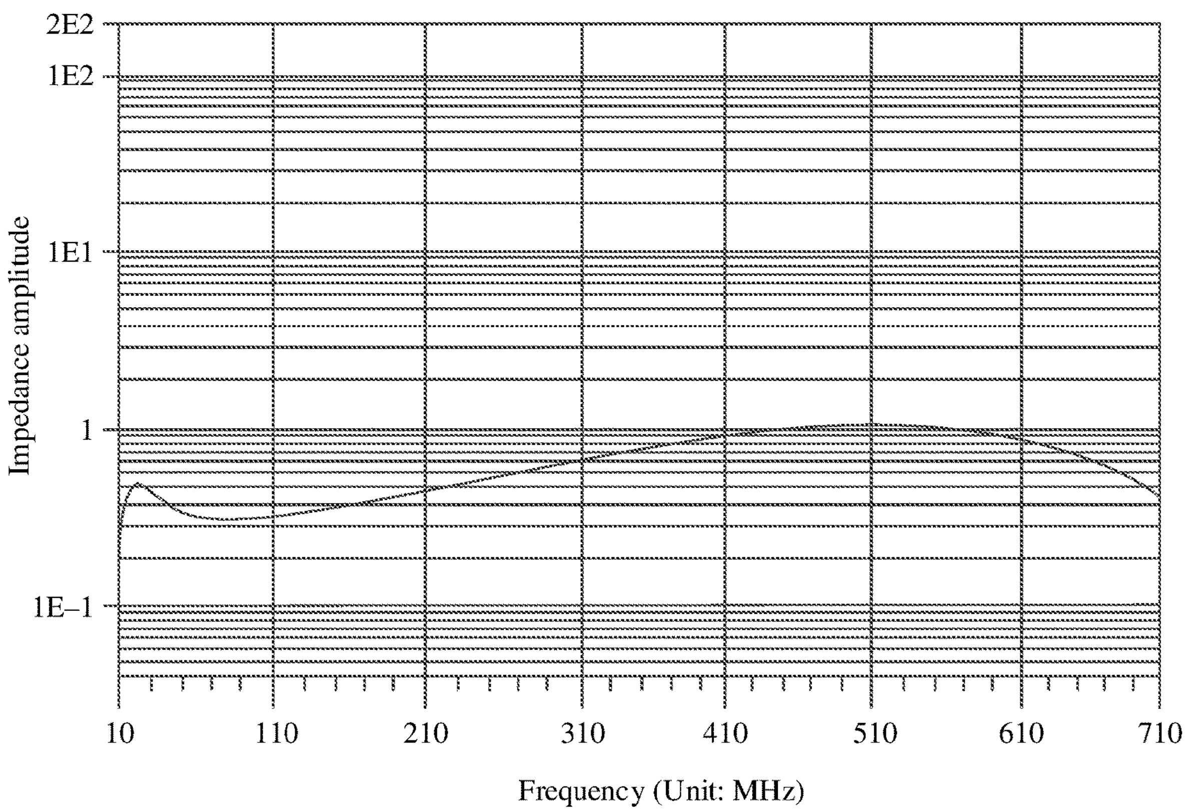
FIG. 2C is a simulation diagram of the multiband power amplifier circuit shown in FIG. 1*c;*
Figure 3:
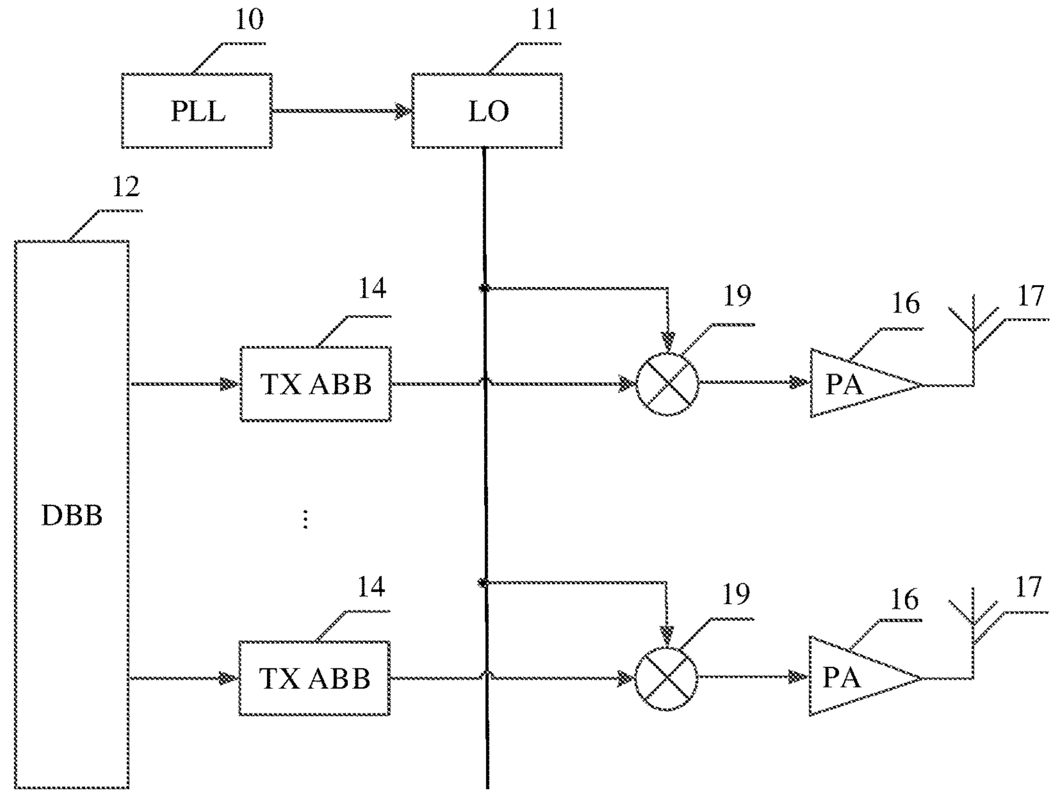
FIG. 3 is a schematic diagram of a structure of a multi-antenna radio frequency transceiver according to an embodiment of this application.

FIG. 3 shows a structure of a multi-antenna radio frequency transceiver used in a communication apparatus. The transceiver includes a phase-locked loop (PLL) 10, a local oscillator (LO) 11, a digital baseband (DBB) 12, and a plurality of radio frequency circuits. Each radio frequency circuit includes a transmitter analog baseband (TX ABB) 14, a power amplifier (PA) 16, an antenna 17, and a frequency mixer 19. The PA 16 may be implemented by a multiband power amplifier circuit provided in embodiments of this application.

First, connection relationships between the foregoing devices are described.

An output end of the PLL 10 is connected to an input end of the LO 11. For radio frequency circuit, an output end of the LO 11 is connected to a first input end of the frequency mixer 19.

On a transmission link of each group of radio frequency circuits, the DBB 12 is connected to an input end of the TX ABB 14, an output end of the TX ABB 14 is connected to a second input end of the frequency mixer 19, an output end of the frequency mixer 19 is connected to an input end of the PA 16, and an output end of the PA 16 is connected to the antenna 17.

The following describes functions of the foregoing devices.

The PLL 10 is configured to output a first oscillation signal of a fixed clock frequency for each channel to the LO 11.

The LO 11 is configured to process (optionally perform frequency division, and optionally output a quadrature phase) the first oscillation signal and output transmission oscillation signals of a plurality of local oscillation frequencies.

The DBB 12 is configured to send a digital signal to the transmission link.

The TX ABB 14 is configured to filter and amplify the digital signal from the DBB 12.

The frequency mixer 19 is configured to perform frequency mixing on the transmission oscillation signals (and optionally a signal output by the TX ABB 14), and output, to the PA 16, a signal obtained through frequency mixing.

The PA 16 is configured to amplify the high-frequency signal obtained through frequency mixing.

Optionally, the communication apparatus in embodiments of this application may be a device that includes a wireless transceiver function. The communication apparatus may also be referred to as a terminal device, user equipment (UE), an access terminal, a subscriber unit, a subscriber station, a mobile station, a mobile console, a remote station, a remote terminal, a mobile device, a user terminal, a terminal, a wireless communication apparatus, a user agent, or a user apparatus. For example, the communication apparatus may be a mobile phone, a smart speaker, a smartwatch, a handheld device with a wireless communication function, a computing device, another processing device connected to a wireless modem, a robot, an unmanned aerial vehicle, a smart driving vehicle, a smart home, an in-vehicle device, a medical device, a smart logistics device, a wearable device, a wireless fidelity (Wi-Fi) device, a terminal device in a future 5th generation (5G) network, or a terminal device in a network after 5G. This is not limited in this embodiment of this application.

Figure 4:
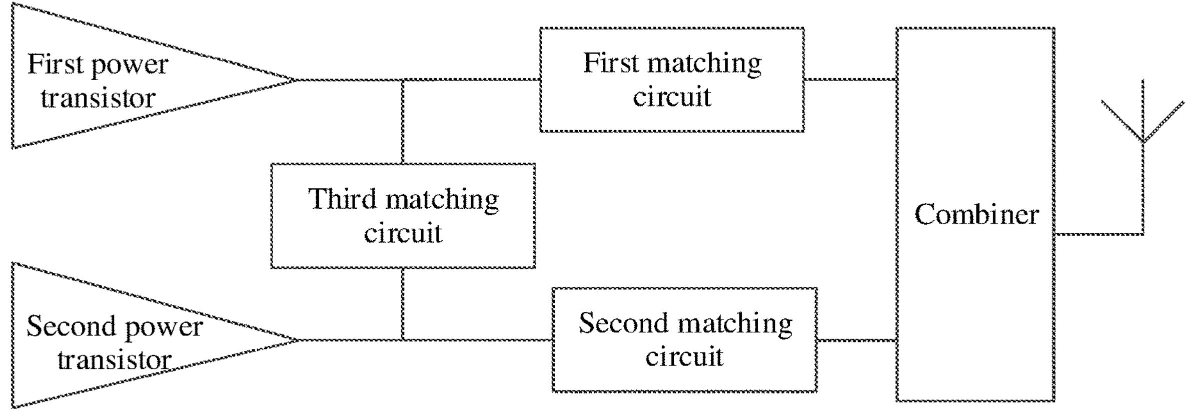
FIG. 4 is a schematic diagram 1 of a structure of a multiband power amplifier circuit according to an embodiment of this application.

As shown in FIG. 4, a multiband power amplifier circuit provided in an embodiment of this application includes a first power transistor, a second power transistor, a first matching circuit, a second matching circuit, a third matching circuit, and a combiner.

The first power transistor is coupled to a first input end of the combiner via the first matching circuit. The second power transistor is coupled to a second input end of the combiner via the second matching circuit. A first end of the third matching circuit is coupled to an output end of the first power transistor, and a second end of the third matching circuit is coupled to an output end of the second power transistor. The third matching circuit is configured to directly connect the output end of the first power transistor to the output end of the second power transistor.

Optionally, in this embodiment of this application, the third matching circuit may be at least one of a microstrip, an inductor, a bonding wire, or an integrated passive device.

Optionally, in this embodiment of this application, the third matching circuit is located inside packages/a package of the first power transistor and/or the second power transistor, or the third matching circuit is located outside packages of the first power transistor and the second power transistor, or the third matching circuit is located on an output pad of a die of the first power transistor and an output pad of a die of the second power transistor.

In addition, in this embodiment of this application, functions of other devices and/or circuits other than the third matching circuit shown in FIG. 4 may be as follows:

The first power transistor is always configured to amplify an input signal of a multiband power amplifier circuit. When the first power transistor reaches a saturation state, the second power transistor and the first power transistor are configured to amplify the input signal of the multiband power amplifier circuit. When the first power transistor does not reach the saturation state, the second power transistor does not operate, and only the first power transistor operates.

Optionally, when the first power transistor and the second power transistor operate at the same time, the first matching circuit is configured to reduce an equivalent load of the first power transistor, so as to increase an output current of the first power transistor. Further, the output current of the first power transistor increases, and an output current of the combiner also increases, so that output power of the multiband power amplifier circuit increases.

The second matching circuit is configured to ensure that the second power transistor operates normally.

The combiner is configured to combine two input signals into one signal.

According to the multiband power amplifier circuit provided in this embodiment of this application, the third matching circuit does not include an LC resonance circuit because the third matching circuit directly connects the output end of the first power transistor to the output end of the second power transistor. This can avoid an additional resonance point caused by introducing the LC resonance circuit. In addition, because the third matching circuit directly connects the output end of the first power transistor to the output end of the second power transistor, the third matching circuit does not include a resistor. This can avoid additional losses caused by introducing the resistor. For the output end of the first power transistor, because the first matching circuit is connected in parallel to the third matching circuit, and the third matching circuit is connected in series to the second matching circuit, the first matching circuit is connected in parallel to the second matching circuit. Alternatively, for the output end of the second power transistor, because the second matching circuit is connected in parallel to the third matching circuit, and the third matching circuit is connected in series to the first matching circuit, the first matching circuit is connected in parallel to the second matching circuit. Further, the first matching circuit is connected in parallel to the second matching circuit. This can decrease equivalent inductance of the first matching circuit and/or the second matching circuit. Further, it can be learned from the formula $$f = \frac{1}{2\pi\sqrt{LC}}$$

that, the inductor L or the capacitor C is inversely proportional to a value of the resonance frequency f. Therefore, as the equivalent inductance of the first matching circuit and/or the second matching circuit decreases, equivalent inductance of the entire multiband power amplifier circuit decreases, and a resonance frequency increases. Further, because a value of a resonance frequency of a resonance point corresponding to a maximum value of an impedance amplitude is a VBW, a VBW of the multiband power amplifier circuit increases accordingly with the increase of the resonance frequency of the multiband power amplifier circuit.

In conclusion, the multiband power amplifier circuit provided in this embodiment of this application can increase the VBW and improve VBW-related features. In addition, the multiband power amplifier circuit provided in this embodiment of this application can further improve a fundamental wave matching bandwidth, to implement good fundamental wave matching. This reduces a gap in performance such as linearity and efficiency between the multiband power amplifier circuit and a single-band power amplifier circuit on a specific frequency band.

Figure 5:
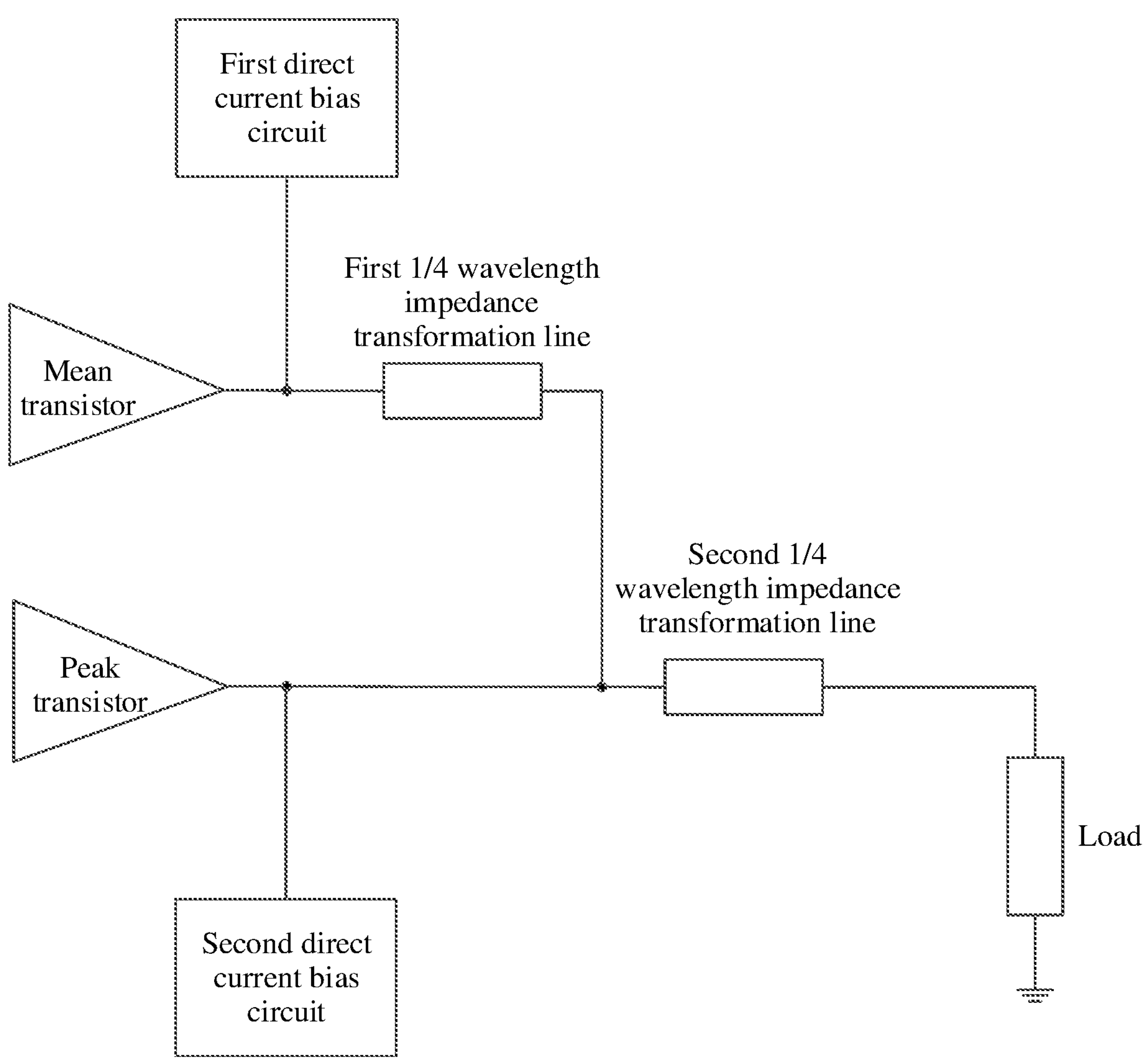
FIG. 5 is a schematic diagram of a structure of a DHT power amplifier circuit in the conventional technology.

FIG. 5 is a schematic diagram of a structure of a Doherty (DHT) power amplifier circuit in the conventional technology. The DHT power amplifier circuit includes a mean transistor, a peak transistor, a first direct current bias circuit, a second direct current bias circuit, a first ¼ wavelength impedance transformation line, a second ¼ wavelength impedance transformation line, and a load. For a working principle of the DHT power amplifier circuit, refer to the conventional technology. Details are not described herein again.

With reference to the multiband power amplifier circuit shown in FIG. 4, the mean transistor in FIG. 5 may correspond to the first power transistor in FIG. 4, the peak transistor in FIG. 5 may correspond to the second power transistor in FIG. 4, the first direct current bias circuit and the first ¼ wavelength impedance transformation line in FIG. 5 may correspond to the first matching circuit in FIG. 4, and the second direct current bias circuit in FIG. 5 may correspond to the second matching circuit in FIG. 4. Alternatively, the mean transistor in FIG. 5 may correspond to the second power transistor in FIG. 4, the peak transistor in FIG. 5 may correspond to the first power transistor in FIG. 4, the first direct current bias circuit and the first ¼ wavelength impedance transformation line in FIG. 5 may correspond to the second matching circuit in FIG. 4, and the second direct current bias circuit in FIG. 5 may correspond to the first matching circuit in FIG. 4. This is not limited in this embodiment of this application. In addition, the second ¼ wavelength impedance transformation line in FIG. 5 may correspond to the combiner in FIG. 4, and the load may correspond to a sum of equivalent impedance of the antenna and equivalent impedance of a back-end circuit of the antenna on the transmission link in FIG. 4.

Figure 6:
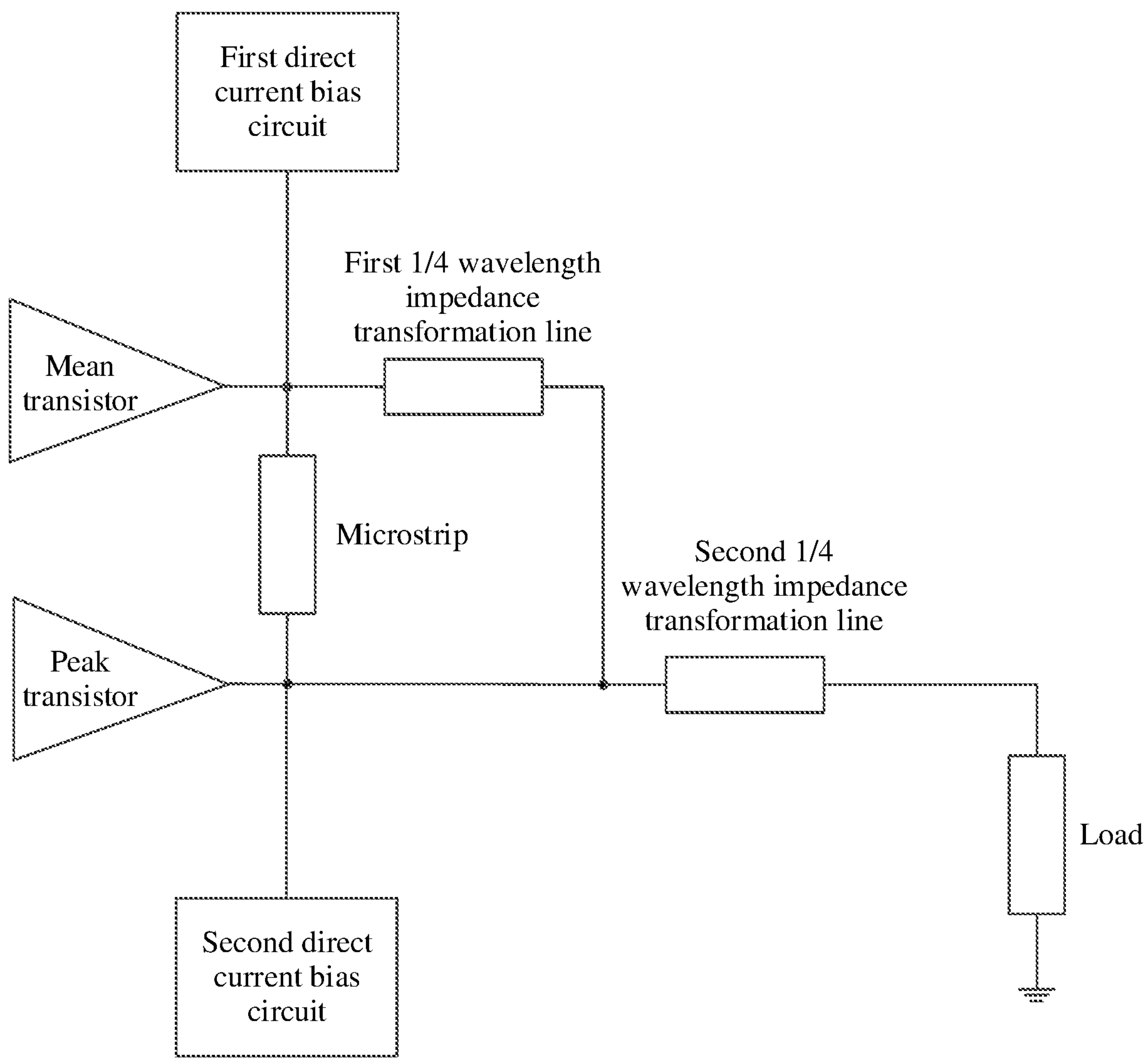
FIG. 6 is a schematic diagram 2 of a structure of a multiband power amplifier circuit according to an embodiment of this application.

In addition, in a possible implementation, as shown in FIG. 6, the third matching circuit in FIG. 4 may be, for example, a section of microstrip.

Specifically, functions of devices and/or circuits shown in FIG. 6 may be as follows:

The mean transistor is always configured to amplify an input signal of a multiband power amplifier circuit. When the mean transistor reaches a saturation state, a peak transistor and the mean transistor are configured to amplify the input signal of the multiband power amplifier circuit. When the mean transistor does not reach the saturation state, the peak transistor does not operate, and only the mean transistor operates.

The first direct current bias circuit is configured to provide a direct current for the mean transistor. Similarly, the second direct current bias circuit is configured to provide a direct current for the peak transistor.

Optionally, when the mean transistor and the peak transistor operate at the same time, the first ¼ wavelength impedance transformation line is configured to reduce an equivalent load of the mean transistor, so as to increase an output current of the mean transistor. Further, the output current of the mean transistor increases, and an output current of the combiner also increases, so that output power of a power amplifier increases.

The second ¼ wavelength impedance transformation line is configured to combine two input signals into one signal.

Optionally, a working process of the multiband power amplifier circuit shown in FIG. 6 may be divided into the following three phases:

Phase 1: As the input signal of the multiband power amplifier circuit is a small signal, only the mean transistor operates and the peak transistor does not operate. Specifically, after the input signal of the multiband power amplifier circuit passes through the mean transistor and the first ¼ wavelength impedance transformation line, power of the signal is amplified.

Phase 2: As the input signal of the multiband power amplifier circuit is continuously enhanced, when the mean transistor reaches the saturation state, the peak transistor is on, and operates together with the mean transistor. Specifically, one input signal of the multiband power amplifier circuit passes through the mean transistor and the first ¼ wavelength impedance transformation line, the other input signal passes through the peak transistor or passes through the mean transistor and the microstrip, and the second ¼ wavelength impedance transformation line combines the two input signals into one signal. Power of the signal is amplified. In this case, output voltage of the mean transistor in the saturation state is constant. However, because the equivalent load of the mean transistor is continuously reduced, the output current of the mean transistor is continuously increased, so that the signal power can be continuously amplified.

Phase 3: As the input signal of the multiband power amplifier circuit is continuously enhanced, the output voltage of the mean transistor in the saturation state is constant, and the output current is continuously increased. When the peak transistor also reaches the saturation state, output currents of the mean transistor and the peak transistor each reach a maximum value. In this case, the signal power output by the multiband power amplifier circuit also reaches a maximum value.

Optionally, because a conventional matching circuit is limited by a size of a device package, an output end of the mean transistor is not connected to an output end of the peak transistor, and only a single direct current bias circuit design can be used for the mean transistor and the peak transistor, as shown in FIG. 5. In other words, the mean transistor can be coupled to the first direct current bias circuit. However, because the first ¼ wavelength impedance transformation line is very long, impedance of coupling the output end of the mean transistor to the second direct current bias circuit via the first ¼ wavelength impedance transformation line and the output end of the peak transistor is very high, and the mean transistor cannot be coupled to the second direct current bias circuit, that is, only the single direct current bias circuit can be implemented for the mean transistor. Similarly, the peak transistor can be coupled to the second direct current bias circuit. However, because the first ¼ wavelength impedance transformation line is very long, impedance of coupling the output end of the peak transistor to the first direct current bias circuit via the first ¼ wavelength impedance transformation line and the output end of the mean transistor is very high, and the peak transistor cannot be coupled to the first direct current bias circuit, that is, only the single direct current bias circuit can be implemented for the peak transistor.

Figure 7:
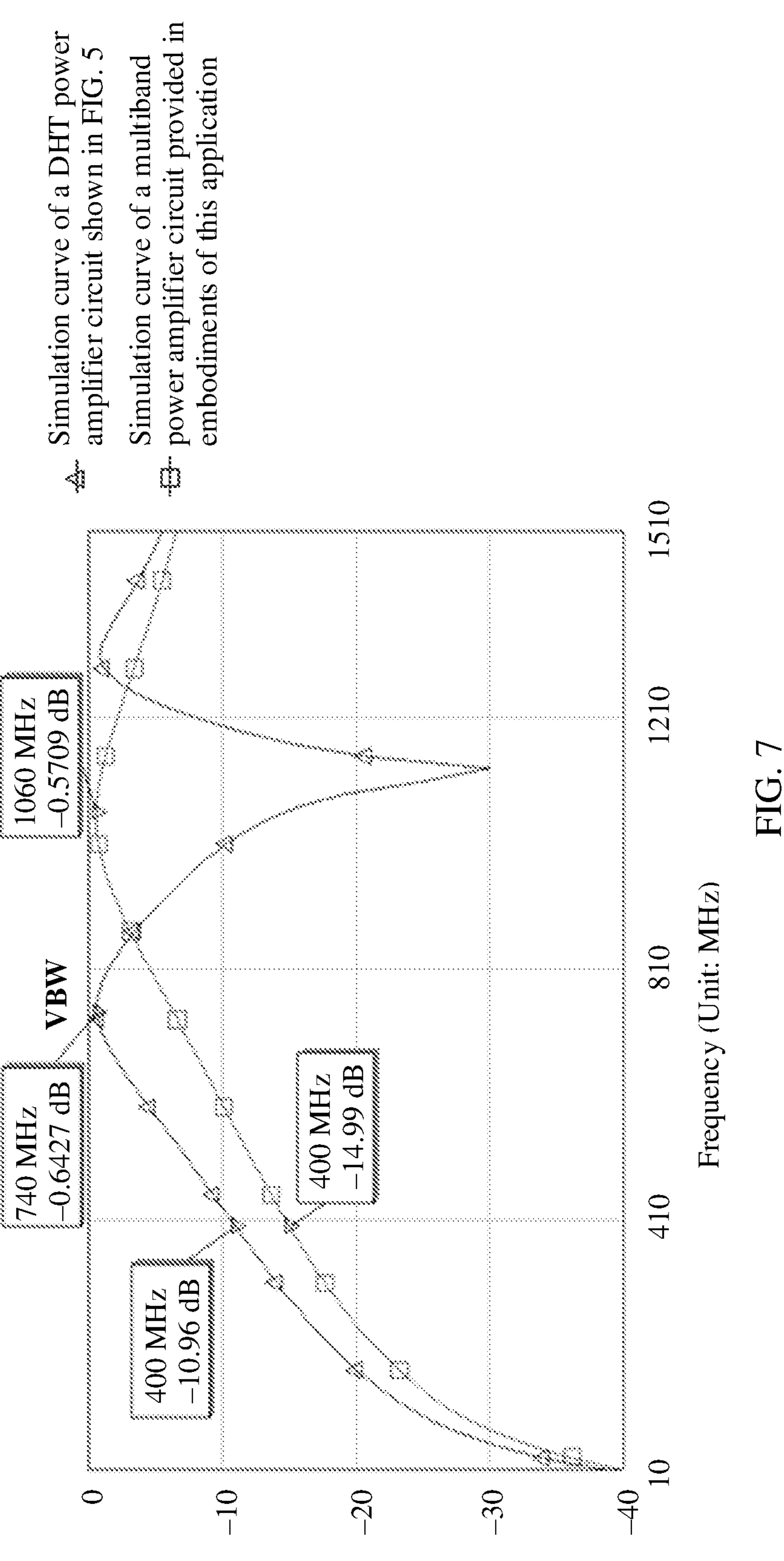
FIG. 7 is a simulation diagram of a multiband power amplifier circuit according to an embodiment of this application.

However, in this embodiment of this application, the microstrip can directly connect the output end of the mean transistor and the output end of the peak transistor, to establish a new direct current connection. This implements a dual direct current bias circuit design for the mean transistor and the peak transistor. The following describes technical effects achieved in embodiments of this application with reference to FIG. 7 and Table 1.

Because the microstrip does not include an LC resonance circuit, an additional resonance point caused by introducing the LC resonance circuit can be avoided. In addition, because the microstrip does not include a resistor either, additional losses caused by introducing the resistor can be avoided. For example, in a simulation diagram shown in FIG. 7, it can be learned that, in addition to a resonance point corresponding to a VBW, no additional resonance point is introduced to the multiband power amplifier circuit provided in embodiments of this application, so that linear correction of the circuit can be ensured.

For the output end of the mean transistor, because the first direct current bias circuit is connected in parallel to the microstrip, and the microstrip is connected in series to the second direct current bias circuit, the first direct current bias circuit is connected in parallel to the second direct current bias circuit. For the output end of the peak transistor, because the second direct current bias circuit is connected in parallel to the microstrip, and the microstrip is connected in series to the first direct current bias circuit, the first direct current bias circuit is connected in parallel to the second direct current bias circuit. Further, the first direct current bias circuit is connected in parallel to the second direct current bias circuit, so that equivalent inductance of the first direct current bias circuit and/or the second direct current bias circuit can be reduced. This can increase a resonance frequency of the entire circuit, and achieve technical effects of increasing the VBW. For example, in the simulation diagram shown in FIG. 7, it can be seen that a VBW of the multiband power amplifier circuit provided in embodiments of this application is 1060 MHz, and a VBW of the DHT power amplifier circuit shown in FIG. 5 is 740 MHz. Therefore, a value of the VBW of the multiband power amplifier circuit provided in this embodiment of this application is greater than a value of the VBW of the circuit shown in FIG. 5.

In conclusion, the multiband power amplifier circuit provided in embodiments of this application can increase the VBW and improve the VBW-related features. In addition, the multiband power amplifier circuit provided in embodiments of this application can also increase the fundamental wave matching bandwidth. Optionally, the fundamental wave matching bandwidth may be measured by using an impedance error. The impedance error indicates an error between actual fundamental impedance and target fundamental impedance, and the impedance error meets the following Formula (1):

$$\varepsilon = 20 \cdot lg\left|\frac{Z_m - Z_t}{Z_m - Z_t^*}\right| \quad \text{Formula (1)}$$

where $Z_m$ indicates the actual fundamental impedance, $Z_t$ indicates the target fundamental impedance, and $Z_t^*$ indicates a conjugate of $Z_t$. A smaller value of the impedance error indicates a wider fundamental wave matching bandwidth, and better fundamental wave matching. In a specific frequency band, a gap in performance such as linearity and efficiency between the multiband power amplifier circuit and a single-band power amplifier circuit is smaller. For example, when fundamental wave frequencies are 1840 MHz and 2140 MHz, impedance error calculation results corresponding to the DHT power amplifier circuit shown in FIG. 5 and the multiband power amplifier circuit provided in embodiments of this application are shown in Table 1. It can be learned that, at the two different fundamental wave frequencies, impedance errors corresponding to the multiband power amplifier circuit provided in embodiments of this application are all less than impedance errors corresponding to the DHT power amplifier circuit shown in FIG. 5. Therefore, the multiband power amplifier circuit provided in embodiments of this application can increase the fundamental wave matching bandwidth.

TABLE 1

Impedance error calculation result

| Fundamental wave frequency | 1840 MHz | 2140 MHz |
|---|---|---|
| DHT power amplifier circuit shown in FIG. 5 | −15 dB | −18 dB |
| Multiband power amplifier circuit provided in embodiments of this application | −25 dB | −26 dB |

It should be noted that, in another circuit having power combination, such as balanced combination or non-isolated combination, the technical solutions in embodiments of this application may be used, to increase the VBW and the fundamental wave matching bandwidth.

Figure 8:
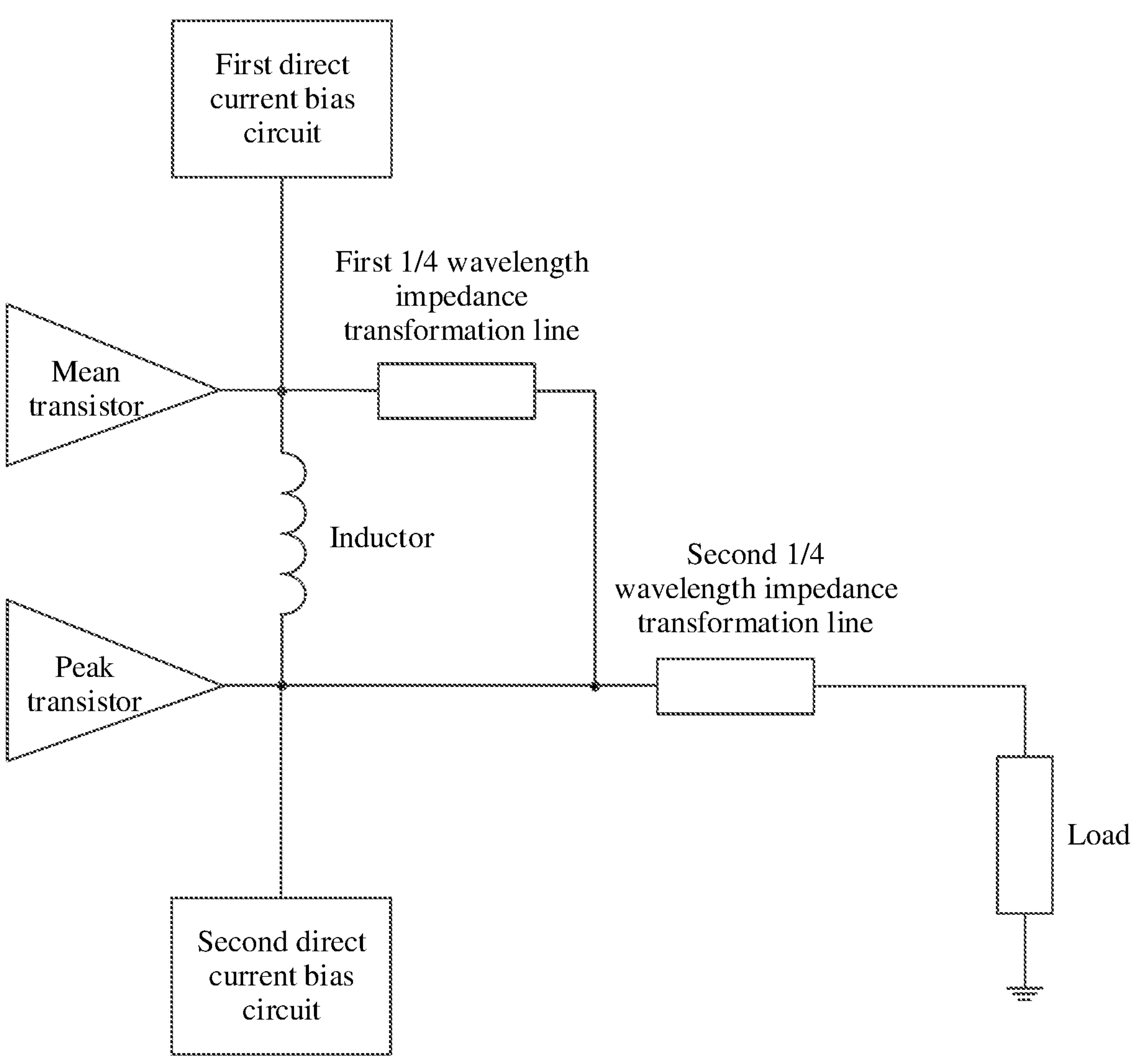
FIG. 8 is a schematic diagram 3 of a structure of a multiband power amplifier circuit according to an embodiment of this application.

In another possible implementation, as shown in FIG. 8, the third matching circuit in FIG. 4 may be, for example, an inductor. For functions of devices and/or circuits that form the multiband power amplifier circuit and a working process of the multiband power amplifier circuit shown in FIG. 8, refer to the description corresponding to FIG. 6. Details are not described herein again.

Figure 9:
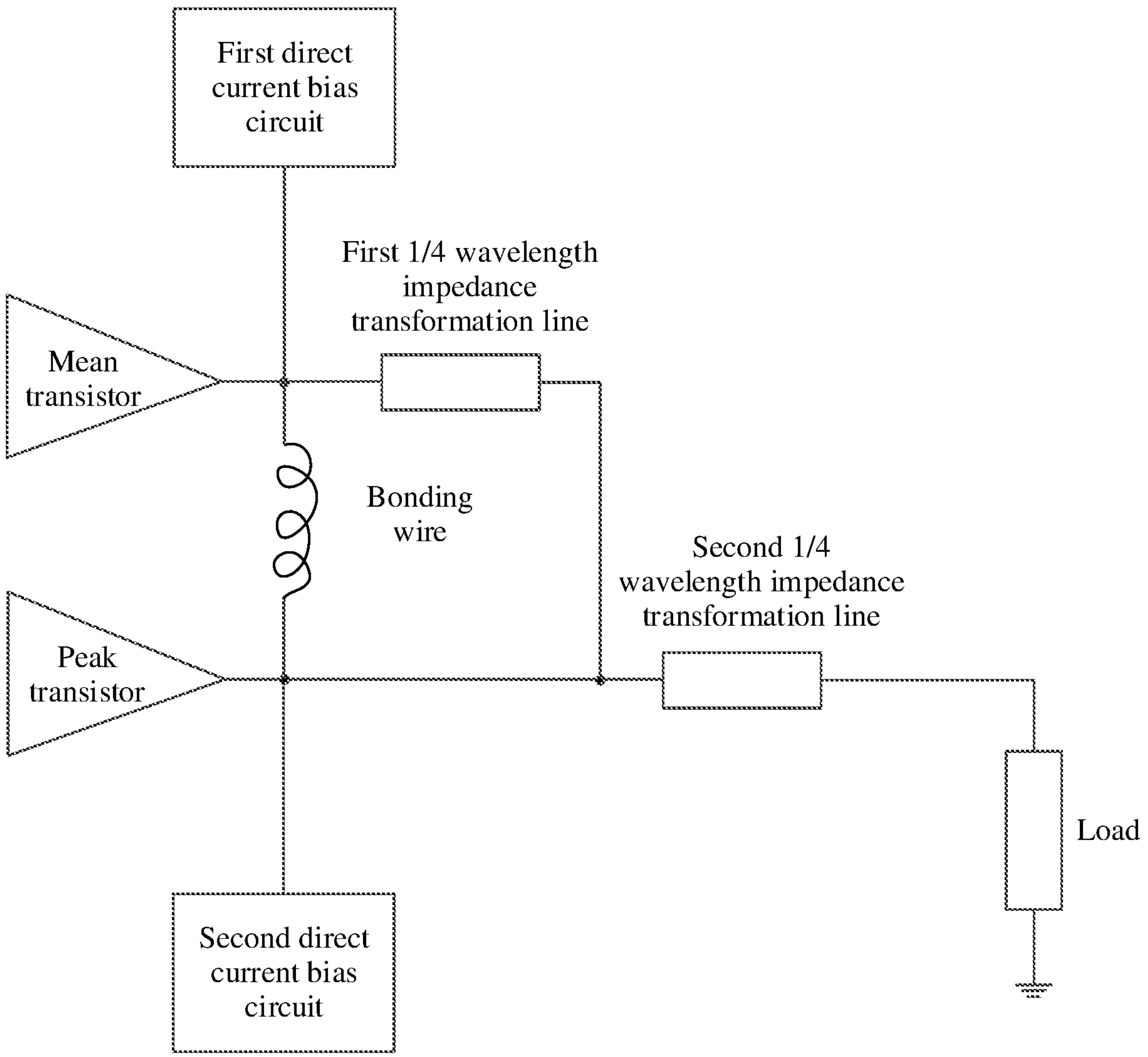
FIG. 9 is a schematic diagram 4 of a structure of a multiband power amplifier circuit according to an embodiment of this application.

In still another possible implementation, as shown in FIG. 9, the third matching circuit in FIG. 4 may be, for example, one or more bonding wires. For functions of devices and/or circuits that form the multiband power amplifier circuit and a working process of the multiband power amplifier circuit shown in FIG. 9, refer to the description corresponding to FIG. 6. Details are not described herein again.

Figure 10:
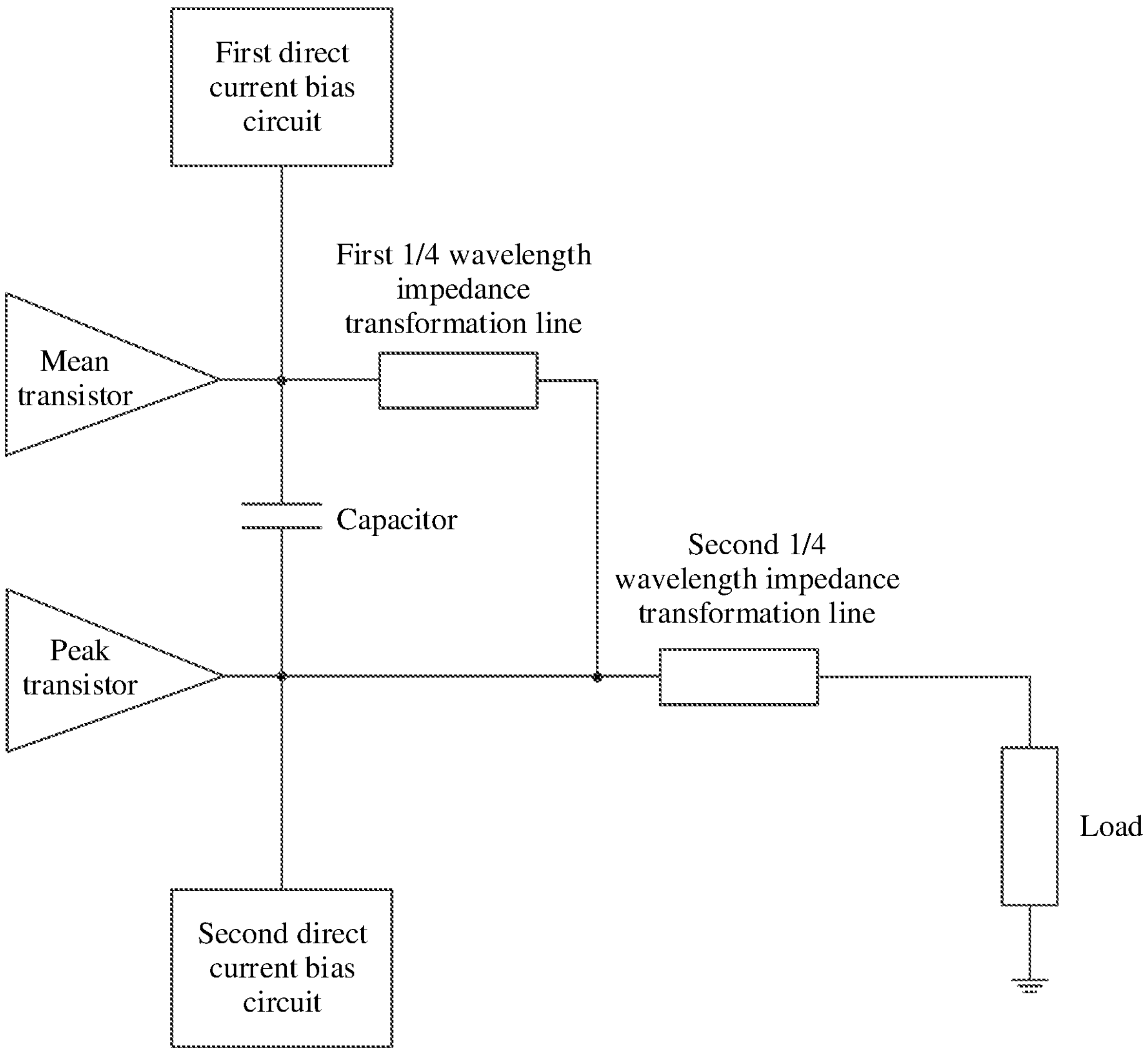
FIG. 10 is a schematic diagram 5 of a structure of a multiband power amplifier circuit according to an embodiment of this application.

In a possible implementation, as shown in FIG. 10, the third matching circuit in FIG. 4 may be, for example, a capacitor. For functions of devices and/or circuits that form the multiband power amplifier circuit and a working process of the multiband power amplifier circuit shown in FIG. 10, refer to the description corresponding to FIG. 6. Details are not described herein again. It should be noted that the multiband power amplifier circuit can only increase a fundamental wave matching bandwidth but cannot increase a VBW defined on a low frequency band, because the capacitor is an alternating current component.

In conclusion, the third matching circuit in embodiments of this application may be a direct current component such as the microstrip, the inductor, or the bonding wire, or a combination thereof, to increase the VBW and the fundamental wave matching bandwidth. Alternatively, the third matching circuit in embodiments of this application may be an alternating current component such as the capacitor or a combination thereof, to improve the fundamental wave matching bandwidth. Certainly, the third matching circuit in embodiments of this application may further include another device for directly connecting the output end of the first power transistor to the output end of the second power transistor. A specific implementation of the third matching circuit is not limited in this application.

A person of ordinary skill in the art may be aware that, in combination with the examples described in embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of embodiments.

In addition, functional units in embodiments of this application may be integrated into one processing unit, each of the units may exist alone physically, or two or more units may be integrated into one unit.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A multiband power amplifier circuit comprising:
- a first power transistor;
- a second power transistor;
- a first matching circuit;
- a second matching circuit;
- a third matching circuit; and
- a combiner, wherein the first power transistor is coupled to a first input end of the combiner via the first matching circuit, wherein the second power transistor is coupled to a second input end of the combiner via the second matching circuit, wherein a first end of the third matching circuit is coupled to an output end of the first power transistor, a second end of the third matching circuit is coupled to an output end of the second power transistor, and wherein the third matching circuit is configured to directly connect the output end of the first power transistor to the output end of the second power transistor, wherein the third matching circuit is a microstrip.

2. The multiband power amplifier circuit according to claim 1, wherein the third matching circuit is located inside a package of the first power transistor or a package of the second power transistor.

3. The multiband power amplifier circuit according to claim 1, wherein the third matching circuit is located inside packages of the first power transistor and the second power transistor.

4. The multiband power amplifier circuit according to claim 1, wherein the third matching circuit is located outside packages of the first power transistor and the second power transistor.

5. The multiband power amplifier circuit according to claim 1, wherein the third matching circuit is located on an output pad of a die of the first power transistor and an output pad of a die of the second power transistor.

6. A radio frequency transceiver comprising:
- a multiband power amplifier circuit comprising a first power transistor, a second power transistor, a first matching circuit, a second matching circuit, a third matching circuit, and a combiner, wherein the first power transistor is coupled to a first input end of the combiner via the first matching circuit, wherein the second power transistor is coupled to a second input end of the combiner via the second matching circuit, wherein a first end of the third matching circuit is coupled to an output end of the first power transistor, a second end of the third matching circuit is coupled to an output end of the second power transistor, and wherein the third matching circuit is configured to directly connect the output end of the first power transistor to the output end of the second power transistor, wherein the third matching circuit is a microstrip; and
- an analog baseband, wherein the analog baseband is configured to output a multiband radio frequency signal to the multiband power amplifier circuit, and the multiband power amplifier circuit is configured to amplify the multiband radio frequency signal.

7. The radio frequency transceiver according to claim 6, wherein the third matching circuit is located inside a package of the first power transistor or a package of the second power transistor.

8. The radio frequency transceiver according to claim 6, wherein the third matching circuit is located inside packages of the first power transistor and the second power transistor.

9. The radio frequency transceiver according to claim 6, wherein the third matching circuit is located outside packages of the first power transistor and the second power transistor.

10. The radio frequency transceiver according to claim 6, wherein the third matching circuit is located on an output pad of a die of the first power transistor.

11. The radio frequency transceiver according to claim 6, wherein the third matching circuit is located on an output pad of a die of the first power transistor and an output pad of a die of the second power transistor.

12. A multi-antenna radio frequency transceiver comprising:
- a phase-locked loop;
- a local oscillator;
- a digital baseband; and a plurality of radio frequency circuits, each of the plurality of radio frequency circuits comprising a transmitter analog baseband, a power amplifier, an antenna, and a frequency mixer, the power amplifier comprising a first power transistor, a second power transistor, a first matching circuit, a second matching circuit, a third matching circuit, and a combiner, wherein the first power transistor is coupled to a first input end of the combiner via the first matching circuit, wherein the second power transistor is coupled to a second input end of the combiner via the second matching circuit, wherein a first end of the third matching circuit is coupled to an output end of the first power transistor, a second end of the third matching circuit is coupled to an output end of the second power transistor, and wherein the third matching circuit is configured to directly connect the output end of the first power transistor to the output end of the second power transistor, wherein the third matching circuit is a microstrip.

13. The multi-antenna radio frequency transceiver of claim 12, wherein an output of the phase-locked loop is coupled to an input of the local oscillator, wherein an output end of the local oscillator is coupled to a first input end of the frequency mixer, wherein the digital baseband is coupled to an input end of the transmitter analog baseband, wherein an output end of the transmitter analog baseband is coupled to a second input end of the frequency mixer, wherein an output end of the frequency mixer is coupled to an input end of the power amplifier, and wherein an output end of the power amplifier is connected to the antenna.

* * * * *